(12) United States Patent
Zhao (10) Patent No.: US 10,536,153 B1
(45) Date of Patent: Jan. 14, 2020

(54) SIGNAL GENERATOR

(71) Applicant: Dialog Semiconductor B.V., s-Hertogenbosch (NL)

(72) Inventor: Duan Zhao, Utrecht (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/456,606

(22) Filed: Jun. 28, 2019

(51) Int. Cl.
*H03L 7/093* (2006.01)
*H04L 27/20* (2006.01)

(52) U.S. Cl.
CPC ............ *H03L 7/093* (2013.01); *H04L 27/20* (2013.01)

(58) Field of Classification Search
None
See application file for complete search history.

(56) References Cited

U.S. PATENT DOCUMENTS

| | | | | |
|---|---|---|---|---|
| 6,915,081 B2* | 7/2005 | Takeshita | ............ | H03D 13/004 398/150 |
| 7,339,861 B2* | 3/2008 | Minamino | ............ | H03L 7/085 327/159 |
| 7,564,313 B2* | 7/2009 | Hung | ............ | G11B 20/10009 327/156 |
| 8,138,841 B2* | 3/2012 | Wan | ............ | H03L 7/18 331/11 |
| 8,275,001 B1* | 9/2012 | Ferguson | ............ | H04J 3/0664 370/509 |
| 10,224,940 B2* | 3/2019 | Sjoland | ............ | H03L 7/081 |
| 2009/0081968 A1* | 3/2009 | Vinayak | ............ | H03F 1/0222 455/110 |
| 2011/0043289 A1* | 2/2011 | Wan | ............ | H03L 7/081 331/25 |
| 2013/0300477 A1* | 11/2013 | Ueda | ............ | H03L 7/099 327/159 |

OTHER PUBLICATIONS

"All-Digital PLL and Transmitter for Mobile Phones," by Robert Bogdan et al., IEEE Journal of Solid-State Circuits, vol. 40, No. 12, Dec. 2005, pp. 2469-2482.

* cited by examiner

*Primary Examiner* — Cassandra F Cox
(74) *Attorney, Agent, or Firm* — Saile Ackerman LLC; Stephen B. Ackerman (57) ABSTRACT

There is provided a signal generator and associated method for generating a source signal. The signal generator includes a frequency generator for providing an oscillating signal, a phase comparator, a first phase modulator, a second phase modulator and a phase shifter. The phase comparator is adapted to compare a phase signal with a feedback signal and to generate an error signal to control the phase of the oscillating signal. The first and second phase modulators are adapted to provide a first phase control word and a second phase control word respectively. The phase shifter is adapted to modulate the oscillating signal based on the second phase control word to generate the source signal. The source signal comprises the feedback signal.

15 Claims, 12 Drawing Sheets

SIGNAL GENERATOR

TECHNICAL FIELD

The present disclosure relates to a signal generator. In particular, the present disclosure related to a signal generator adapted to perform phase modulation.

BACKGROUND

Signal generators, such as phase-locked loops PLL, are used in a wide range of applications requiring source signals for performing different tasks. For instance, a PLL may be used to provide a source signal to a wireless communications system.

In addition to synthesizing the frequency at which a signal is to be transmitted and received, a PLL can also be used for performing frequency and phase modulation of the carrier frequency. To provide phase modulation of the carrier frequency, current PLLs require multiple steps. One method requires first converting a phase modulated input signal to a frequency modulated input signal by taking the derivative of the phase, and then using so called two-point frequency modulation to modulate the PLL carrier frequency. Another method is based on generating two signals with 90 degree phase shifts, referred to as I and Q signals. Then phase modulation can be achieved by adding up the I and Q signals with different amplitude.

These approaches impose very strict restrictions on the performance of the PLL. In turn, this increases the power consumption and the footprint of a semiconductor device that includes such a PLL. It is an object of the disclosure to address one or more of the above-mentioned limitations.

SUMMARY

According to a first aspect of the disclosure, there is provided a signal generator for generating a source signal, the signal generator comprising a frequency generator adapted to provide an oscillating signal; a phase comparator adapted to compare a phase signal with a feedback signal and to generate an error signal to control the phase of the oscillating signal; a first phase modulator adapted to provide a first phase control word; a second phase modulator adapted to provide a second phase control word; a phase shifter adapted to modulate the oscillating signal based on the second phase control word to generate the source signal; wherein the source signal comprises the feedback signal.

Optionally, the error signal is configured to control the phase of the oscillating signal such that the oscillating signal is in phase with the phase signal.

Optionally, the signal generator comprises a phase accumulator adapted to receive an input frequency control word and to generate a phase reference signal, and an adder, the adder being adapted to add the phase reference signal to the first phase control word to generate the phase signal.

Optionally, the phase shifter is adapted to generate a source signal comprising a plurality of component signals each component signal having a different phase with respect to the feedback signal.

Optionally, the phase shifter comprises a digital to time converter.

Optionally, the phase shifter comprises an adaptive filter or a switched filter bank.

Optionally, the phase shifter comprises a combiner provided with a pair of adjustable channel gains coupled to a controller configured to adjust the channel gains based on the second phase control word.

Optionally, the signal generator comprises a first frequency modulator adapted to generate a first frequency modulated control word; and an adder to add the input frequency control word to the first frequency modulated control word to generate an adjusted frequency control word.

Optionally, the signal generator comprises a second frequency modulator coupled to the frequency generator, the second frequency modulator being adapted to generate a second frequency modulated control word to modulate the frequency of the oscillating signal.

Optionally, the signal generator comprises a controller coupled to the first phase modulator, the second phase modulator, the first frequency modulator and the second frequency modulator; the controller being adapted to control a state of the first and second phase modulators and the first and second frequency modulators.

For example, the controller may be adapted to send control signals to enable the phase modulators and disable the frequency modulators or to enable the frequency modulators and disable the phase modulators.

According to a second aspect of the disclosure, there is provide a communication device comprising a signal generator according to the first aspect of the disclosure.

The options described with respect to the first aspect of the disclosure are also common to the second aspect of the disclosure.

According to a third aspect of the disclosure, there is provided a method of generating a source signal, the method comprising generating an oscillating signal; comparing a phase signal with a feedback signal to generate an error signal; controlling a phase of the oscillating signal using the error signal; providing a first phase modulator to generate a first phase control word; providing a second phase modulator to generate a second phase control word; providing a phase shifter to modulate the oscillating signal based on the second phase control word to generate the source signal; wherein the source signal comprises the feedback signal.

Optionally, the error signal controls the phase of the oscillating signal such that the oscillating signal is in phase with the phase signal.

Optionally, the phase signal comprises a sum of a phase reference signal and the first phase control word.

Optionally, the source signal comprises a plurality of component signals each component signal having a different phase with respect to the feedback signal.

The options described with respect to the first aspect of the disclosure are also common to the third aspect of the disclosure.

BRIEF DESCRIPTION OF THE DRAWINGS

The disclosure is described in further detail below by way of example and with reference to the accompanying drawings, in which.

DESCRIPTION

Figure 1:
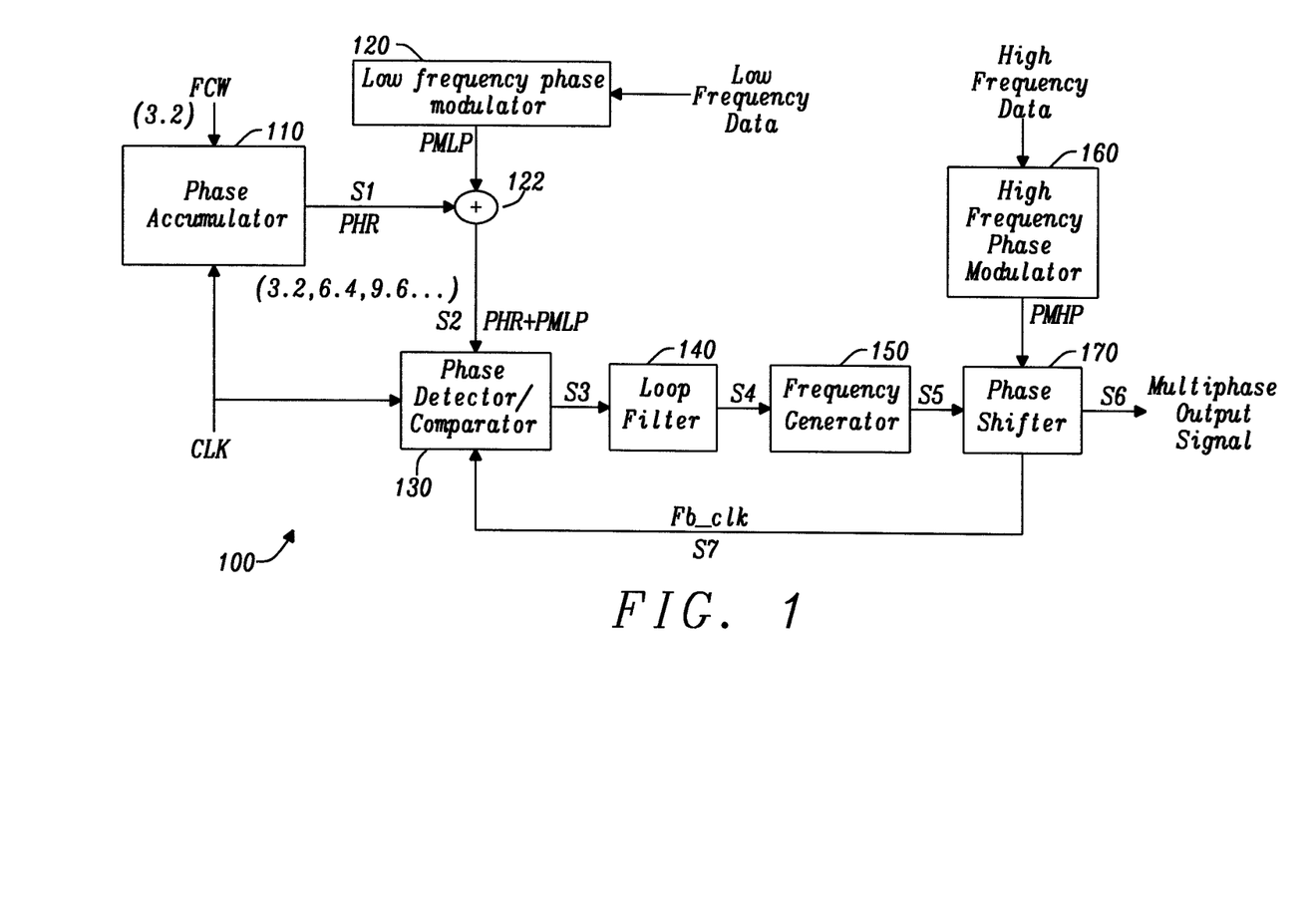
FIG. 1 is a diagram of a signal generator adapted to provide phase modulation.

FIG. 1 illustrates a signal generator adapted to provide phase modulation. For instance, the signal generator may be a phase locked loop PLL such as an all-digital PLL (AD-PLL) or other types of PLL architectures. The circuit 100 includes a phase accumulator 110, a low frequency phase modulator 120, a phase detector 130, a loop filter 140, a frequency generator 150, a high frequency phase modulator 160 and a phase shifter 170 for generating an output signal. The phase detector 130, the loop filter 140, the frequency generator 150 and the phase shifter 170 form a closed loop to control the phase modulation of the output signal.

The frequency generator 150 includes an oscillator, not shown, for providing an oscillating signal having a controllable oscillation frequency. For instance the oscillator may be voltage-controlled oscillator or a digitally-controlled oscillator. The frequency generator 150 may also include a divider coupled to the oscillator for dividing the frequency of the oscillator by a set value.

The low frequency phase modulator 120 and the high frequency phase modulator 160 are used to implement a so called two-point phase modulation. In operation, the data input (low frequency data) from the low frequency phase modulator 120 will be low pass filtered by the PLL loop, while the data input (high frequency data) from the high frequency phase modulator 160 will be high pass filtered. As a result the data transmission bandwidth may be adjusted depending on the application. For instance, a relatively flat bandwidth may be achieved.

In operation, the phase accumulator 110 receives a frequency control word FCW and provides a phase reference signal PHR (S1). The phase accumulator 110 holds a value X. At each clock cycle, the phase accumulator 110 adds the frequency control word (FCW) to the value X, hence producing a new output value. For instance the phase accumulator may be clocked by a reference signal having a period T. At an initial time t0, the output value is X and a data signal is X+FCW. For example the initial output X of the accumulator may be zero. The data signal increases by FCW at each clock cycle. For instance, if the frequency control word FCW is 3.2, the data signal increases to 3.2 at the first clock cycle, then to 6.4 at the second clock cycle and so forth.

Data to be transmitted can be provided to the low/high frequency data path either together or separately. The low frequency phase modulator 120 receives transmission data and generates a phase modulation control word based on the transmission data and referred to as phase modulation low-frequency path (PMLP) control word. The PMLP control word is then added to the reference signal S1 PHR by the adder 122 to provide a signal S2=PHR+PMLP.

The phase shifter 170 outputs a feedback signal Fb_clk S7 at each clock cycle. The phase detector 130 receives the signal S2 from the phase modulator 120 and the feedback signal S7 from the phase shifter 170, compares the signal S2 with the signal S7 and generates an error signal S3 to adjust the phase of the oscillating signal S5 generated by the frequency generator 150 such that the feedback signal S7 is in phase with the signal S2. This is achieved via the loop filter 140 which receives the error signal S3 and provides a filtered error signal S4 to the frequency generator 150. The PLL loop is configured to minimize the error in S3. When the PLL loop is in lock, the PLL loop keeps the signals S2 and S7 in phase. Therefore if the PMLP control word is changed, the feedback signal S7 will track the change of the signal S2.

The high frequency phase modulator 160 receives high frequency data and generates a phase modulation control word based on the high frequency data and referred to as phase modulation high-frequency path (PMHP) control word. The PMHP control word is used to control the phase shifter 170 to change the phase of the input signal S5. The phase shifter 170 then provides an output signal which may be a multiphase output signal. For instance, the phase shifter 170 may be adapted to generate a multiphase output signal comprising a number N of component signals, in which N is an integer equal or greater than two.

The signal generator 100 provides a well-controlled and accurate phase output. The feedback loop is used to correct the output phase. The steps and outputs S6 of the phase shifter 170 can be well calibrated. The signals of S6 are all referenced to a well-controlled signal S7, as a result, each phase of the signals of S6 can be well controlled as well, generating a multiphase output with controllable phases. As a result, the output can be accurately controlled and the nonlinearity in the output of the phase shifter does not dominate the general performance of the system. Compared with conventional PLLs, the signal generator of the description can be used to perform signal modulation of relatively high orders. Furthermore, the phase shifter 170 and the low frequency phase modulator 120 have a small footprint, allowing the signal generator 100 to be implemented in a compact design.

Figure 2:
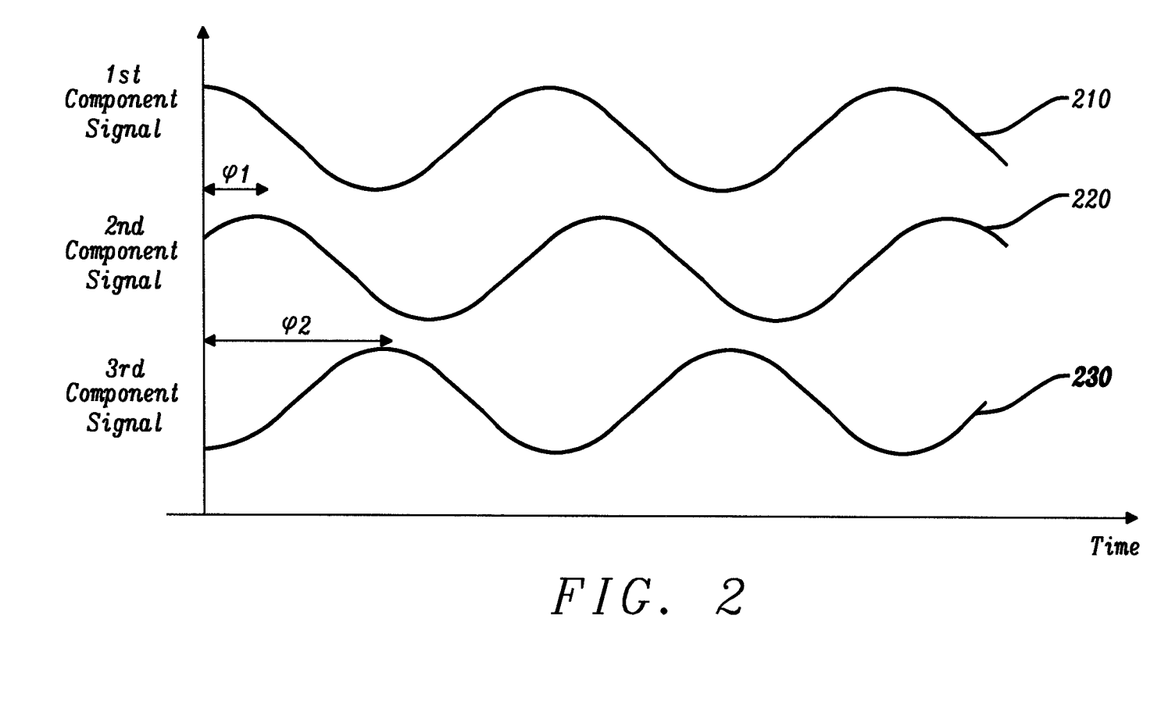
FIG. 2 is a multiphase output signal provided by the signal generator of FIG. 1.

FIG. 2 illustrates an example of a multiphase output signal comprising three signal components: a first component signal 210, a second component signal 220 and a third component 230. The first component signal 210 is a reference signal and may correspond to the feedback signal S7. The second component 220 has a phase difference φ1 with respect to the signal 210. Similarly the third component 230 has a phase difference φ2 with respect to the signal 210. In this way the component signals 210, 220 and 230 can be generated with the same frequency but with different phases.

The phase shifter 170 may be implemented in different ways. For instance the phase shifter may be a digital phase shifter such as digital-to-time converter DTC or a delay-locked loop DLL. The phase shifter may be implemented as a Micro-Electro-Mechanical Systems (MEMS). It will also be appreciated that depending on the application the phase shifter may require to be calibrated. Various calibration techniques may be used.

Figure 3A:
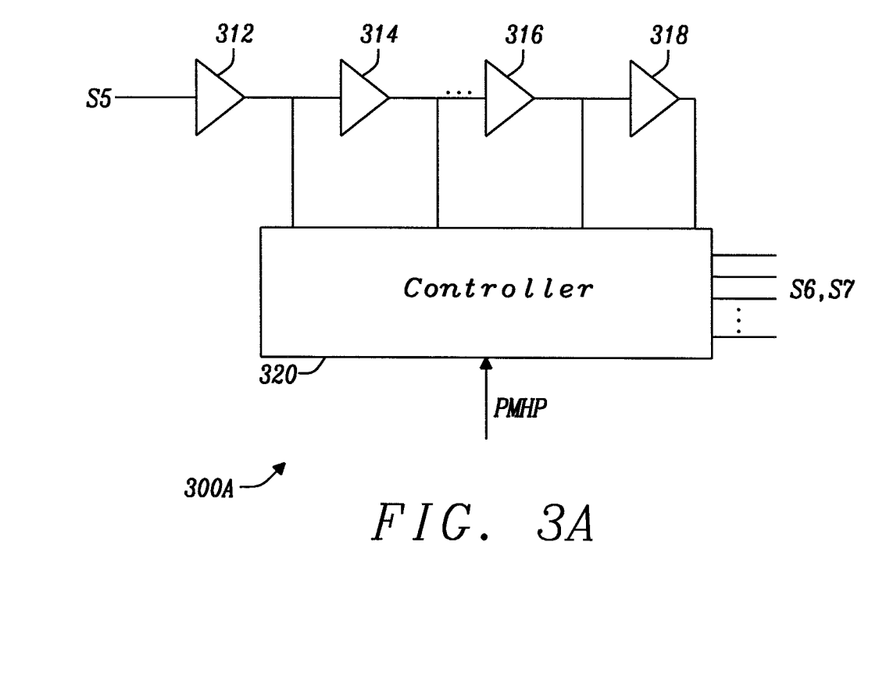
FIG. 3A is a diagram of a phase shifter implemented as a digital-to-time converter.

FIG. 3A illustrates a digital-to-time converter DTC formed by a delay line coupled to a controller 320. In this example the delay line includes a chain of several individual delay elements 312, 314, 316, 318, each delay element providing a fixed delay. The controller 320 is configured to select the outputs of a number of delay elements to achieve a specific phase shift, generating the output signal S6 and feedback signal S7.

The phase shifter may also be provided by an adaptive filter. For instance the adaptive filter may include a combination of capacitive low-pass and high pass filters with programmable component values.

Alternatively, the phase shifter may be provided by a switched filter bank. For instance a Z channels switched filter bank may include a number Z of individual filters (Z channels) provided between an input switch and an output switch. Each individual filter can be designed to provide a fixed amount of phase shift (e.g. 180°, 90°, 45°, 22.5° etc.).

For microwave applications, quarter wavelength loaded lines can also be used, or reflection phase shifters using circulators or hybrid couplers with a variable load on one or more ports.

Figure 3B:
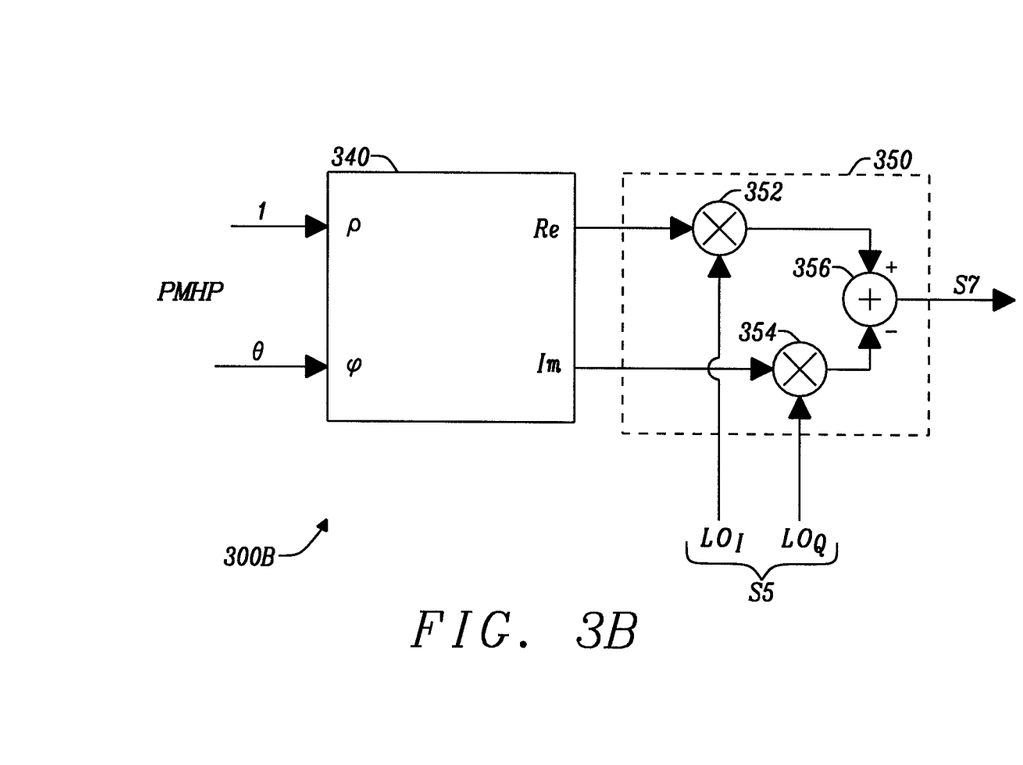
FIG. 3B is a diagram of a phase shifter implemented as a combiner.

FIG. 3B illustrates another exemplary phase shifter. In this embodiment the phase shifter 300B includes a control stage 340 coupled to a combiner 350 provided with a pair of adjustable channel gains 352, 354 and an adder 356. In operation the control stage 340 receives the PMHP control word and generates corresponding real and imaginary signals to adjust the gain of channel gain 352 and 354 respectively. A controlled oscillator, not shown, provides the signal S5. In this case S5 is provided by a pair of amplitude/phase IQ signals labelled as quadrature signals $LO_I$ and $LO_Q$. The quadrature signals are scaled by channel gains 352 and 354 and combined via the adder 356 to provide the desired output signal S6/S7.

Figure 4:
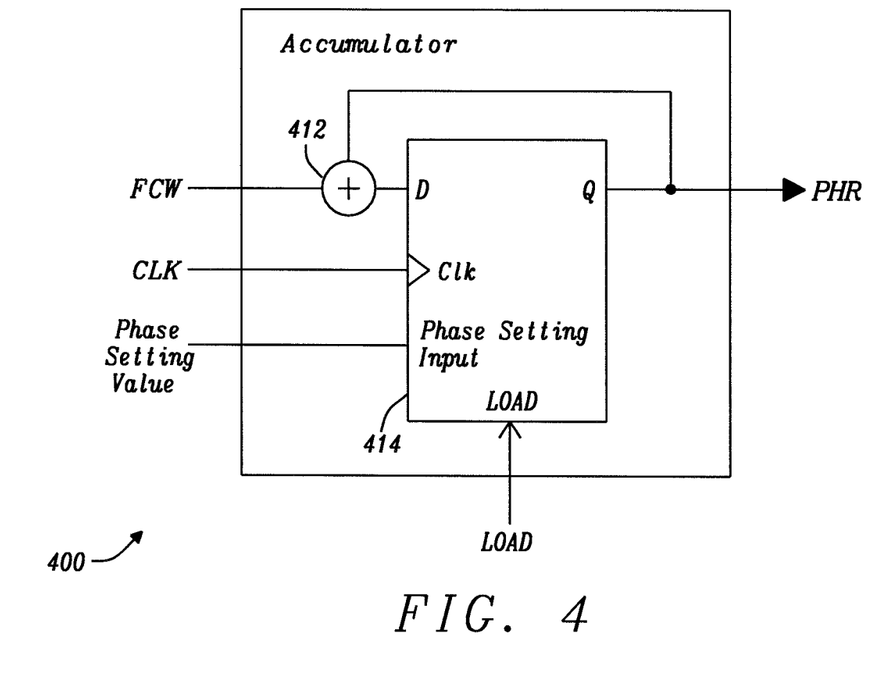
FIG. 4 is a diagram of a phase accumulator.

FIG. 4 shows an exemplary implementation of a phase accumulator for providing a reference phase signal PHR. The accumulator 400 includes an adder 412 coupled to a flip-flop 414. The flip-flop 414 is equipped with four inputs and one output Q for providing a phase reference signal PHR. The inputs include a data input D for receiving the output of the adder 412; a clock input Clk for receiving a clock signal; a phase setting input for receiving a phase setting value; and a load input labelled LOAD for receiving a load signal. The adder 412 has a first input for receiving a frequency control word (FCW), a second input coupled to the output Q and one output coupled to the data input D of the flip-flop 414. In operation, the phase setting value is loaded at a specific time determined by the load signal, to set the flip-flop 414 to a known state. In this way the phase of the reference phase signal PHR may be controlled. Alternatively the accumulator 400 may be implemented as a conventional accumulator, hence without the phase setting input and the load input labelled LOAD for implementing the phase setting reload function.

Figure 5:
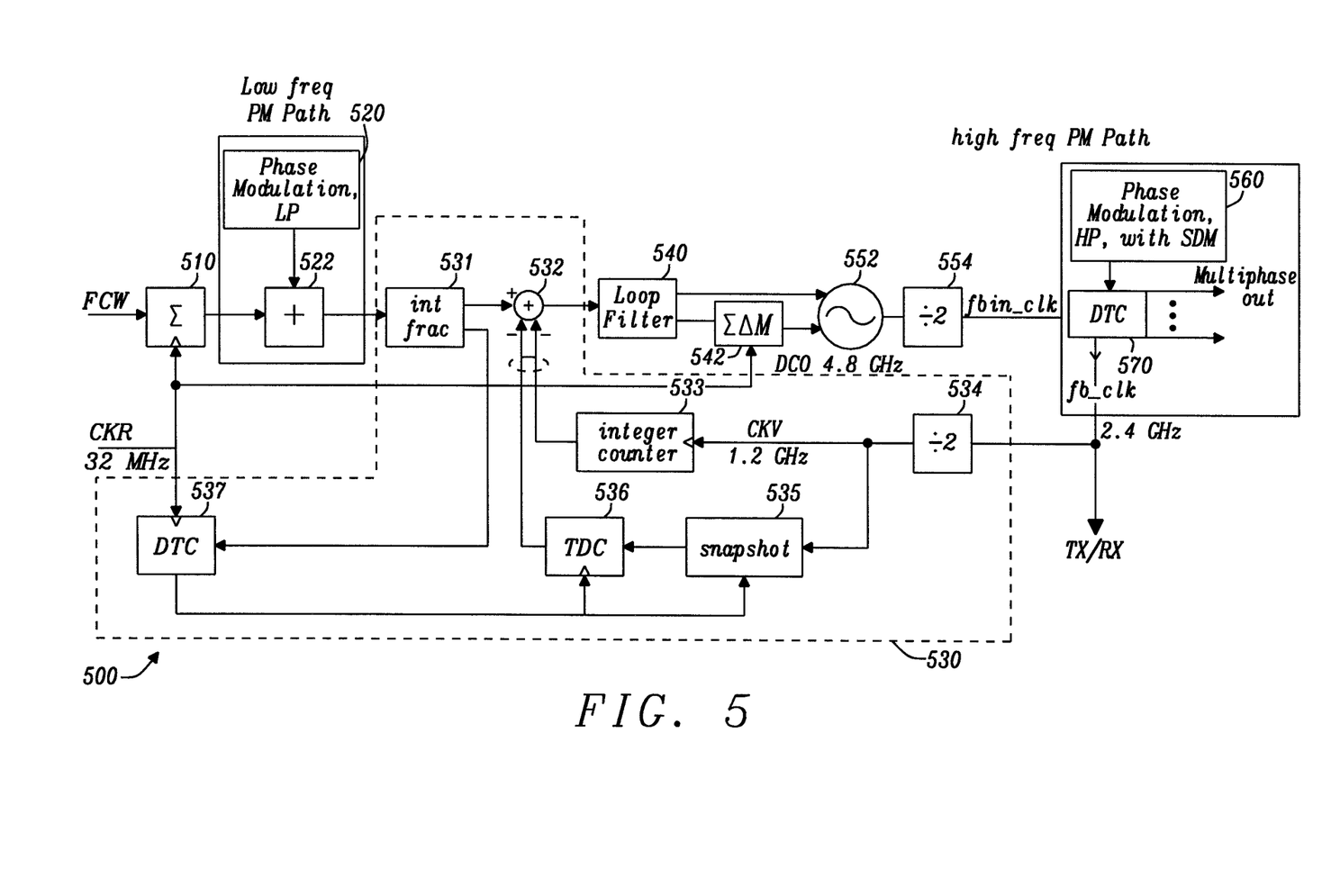
FIG. 5 is an example embodiment of the signal generator of FIG. 1.

FIG. 5 illustrates an exemplary embodiment of the signal generator of FIG. 1. The signal generator may be a phase locked loop PLL such as an all-digital PLL (ADPLL) or other types of PLL architectures. The circuit 500 includes a phase accumulator 510, a low frequency phase modulator 520, a phase detector 530, a loop filter 540, a frequency generator, a high frequency phase modulator 560 and a digital-to-time converter 570. The frequency generator includes a digitally controlled oscillator 552 coupled to a divider 554. Optionally a sigma-delta modulator 542 may be provided at the output of the loop filter 540.

The phase detector 530 has three inputs and one output. The first input is provided with an integrator 531 for receiving a phase signal from the phase modulator 520. The second input is provided with a digital to time converter 537 for receiving a clock signal. The third input is provided with a divider 534 for receiving the feedback signal from the DTC 570. The output of the phase detector 530 is provided with a combiner 532 for delivering an error signal.

The integrator 531 has a first output coupled to the combiner 532 and a second output coupled to the DTC 537. The divider 534 is coupled to the counter 533 to form a first feedback path. The divider 534 is also coupled to the TDC 536 via a snapshot circuit 535 to form a second feedback path. The combiner 532 has a first input to receive the output of the integrator 531, a second input coupled to the first feedback path, and a third input coupled to the second feedback second path. The DTC 537 is coupled to both the TDC 536 and the snapshot circuit 535.

In operation, the phase detector 530 receives a phase signal at the first input 531 and a feedback signal fb_clk from the DTC 570 at the second input 534. The combiner 532 takes the difference of the reference phase at the output of 531 and the measured phase from the outputs of 533 and 536. In this way the phase error can be extracted at the output of 532. When the output of the integrator 531 is equal to the output of the counter 533, a zero frequency error occurs if the output of the TDC 536 is zero, and the output of the combiner 532 is zero when the loop is in lock.

By using a Phase Modulation LP (PMLP) control word, the phase of the feedback clock fb_clk can be accurately controlled. The accuracy of the phase is depending on the numerical accuracy of the phase modulation control word. The phase detector 530 provides an error signal to adjust the phase of the oscillating signal provided by the DCO 552. The divider 554 provides a divided by two clock signal fbin_clk which is sent through a chain of delay elements of the DTC 570 to generate multiple delay phases. The DTC 570 generates a feedback signal fb_clk with an intended delay and multiphase outputs, in which each output has a controllable phase delay compared to fbin_clk or fb_clk. The DTC 570 is controlled by the high frequency phase modulation HP (PMHP) control word generated by the high frequency phase modulator 560. In this way, an instantaneous phase shift can be achieved.

In this approach, the shifted phase is used inside the feedback loop, which provides accurate and linear phase control due to the loop characteristics. All the components of the loop can be characterized automatically with a built-in calibration routine, which guarantees production level robustness. The multiphase output can be used in combination with an outphasing Power Amplifier to support a higher level modulation such as quadrature amplitude modulation (QAM). Alternatively, the multiphase output may be used in antenna arrays to achieve beam forming.

Figure 6:
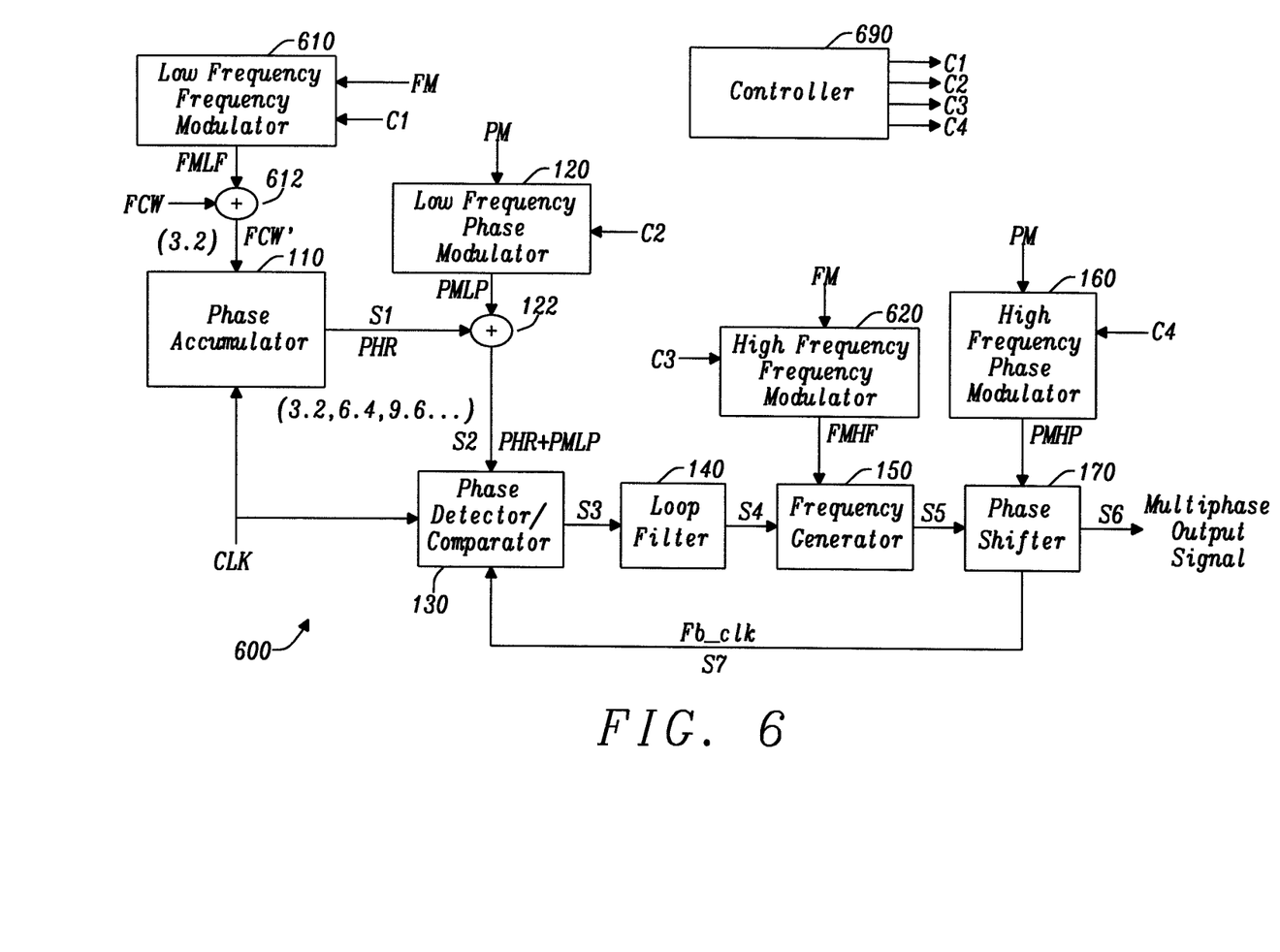
FIG. 6 is a diagram of a signal generator adapted to provide both phase modulation and frequency modulation.

FIG. 6 illustrates a modified version of the circuit of FIG. 1 provided with a low-frequency frequency modulator 610 and a high-frequency frequency modulator 620 for performing two-point frequency modulation. The circuit 600 shares similar components to those illustrated in the circuit 100 of FIG. 1. The same reference numerals have been used to represent corresponding components and their description will not be repeated for sake of brevity.

A controller 690 is coupled to the frequency modulators 610, 620 and to the phase modulators 120, 160. The controller 690 is adapted to generate control signal C1, C2, C3 and C4 to control the state (enabled or disabled) of the modulators 610, 620, 120 and 160 respectively.

The circuit of FIG. 6 can therefore support either phase modulation or frequency modulation or a combination of both phase et frequency modulation based schemes. The frequency modulators 610, 620 and the phase modulators 120, 160 may be enabled or disabled individually depending on the application. For instance signal frequency modulation may be achieved by disabling the phase modulators 120 and 160 and vice versa.

The low-frequency frequency modulator 610 has an input for receiving frequency modulation data FM and an output coupled to an adder 612. The high-frequency frequency modulator 620 has an input for receiving frequency modulation data FM and an output coupled to the frequency generator 150. The frequency modulators 610 and 620 may receive the same frequency modulation data FM. Similarly, the phase modulators 120 and 160 may receive the same phase modulation data PM.

In operation, the low-frequency frequency modulator 610 generates a frequency modulation control word based on the frequency modulation data and referred to as frequency modulation LF (FMLF) control word. The adder 612 adds the frequency words FCW and FMLF to provide an adjusted frequency word FCW' to the phase accumulator 110. The high-frequency frequency modulator 620 generates a frequency modulation control word based on the frequency modulation data and referred to as frequency modulation HF (FMHF) control word. The high-frequency frequency modulator 620 may include an adaptor or processor to provide a signal compatible with a given controlled oscillator of the frequency generator. The FMLF and FMHF control words are used to control the frequency of the oscillating signal generated by the frequency generator 150.

The signal generator 600 allows both frequency modulation and phase modulation to be implemented in a single generator. Such a generator may be used to provide a power-efficient multi-standard transmitter.

Figure 7:
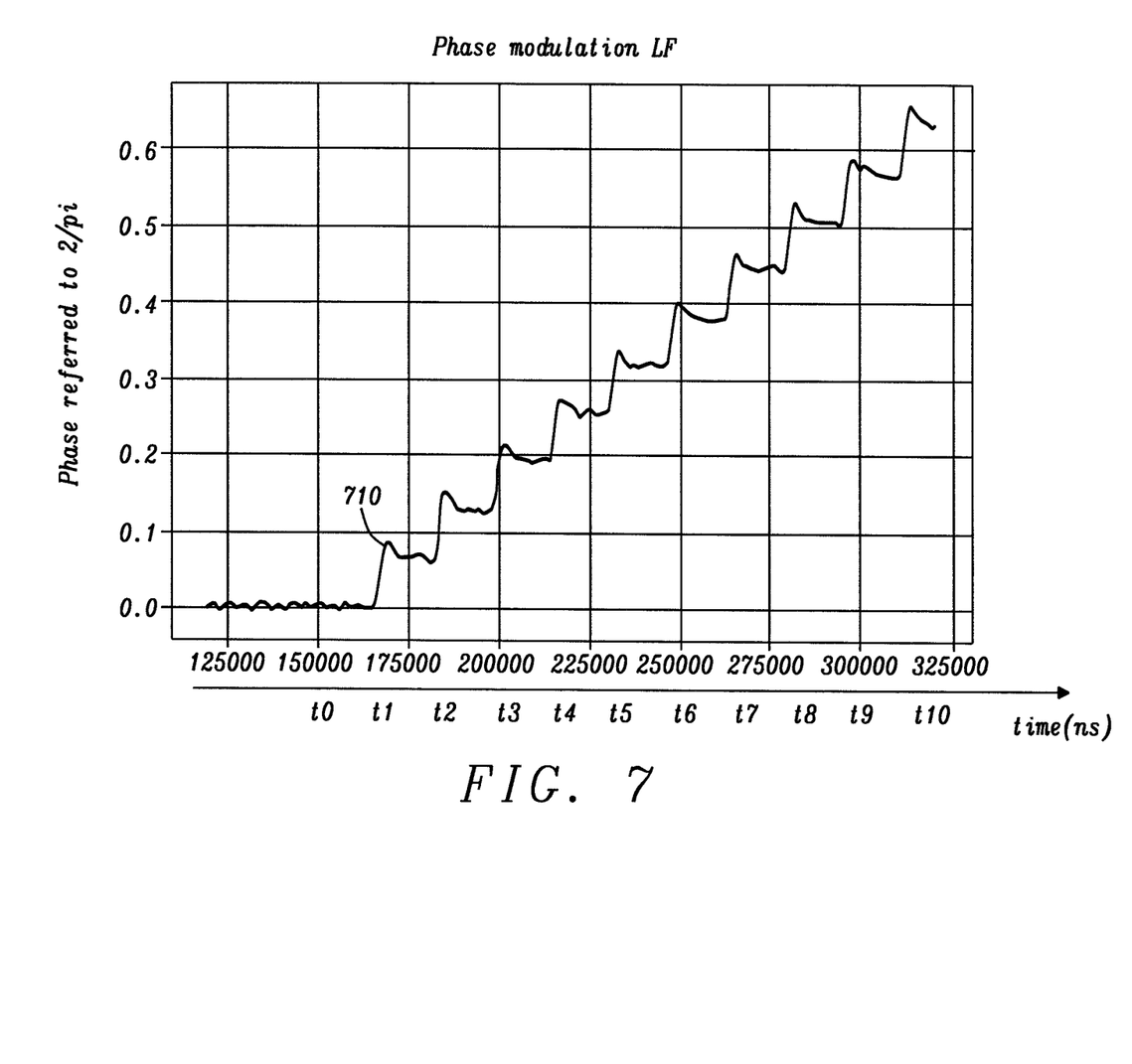
FIG. 7 is a simulation of the phase modulation of an input signal using only the low frequency phase modulator of the circuit of FIG. 1.

FIG. 7 is a simulation of the phase modulation of an input signal using only the low frequency phase modulator 120, i.e by disabling the high frequency phase modulator 160. This simulation represents the phase of the signal S6 or S7 in FIG. 1, when the PMLP control word is increasing. At time t0, the modulated signal has a zero phase, which is a reference phase. At time t1, the input signal to the low frequency phase modulator 120 (the frequency modulation data) is modulated with a first phase of 2π/16. A phase difference of 2π/16 is then added incrementally at times t2-t10. At each incrementation, the output phase overshoots 710 before stabilising. Such a ringing and settling behaviour slows down the response of the system, hence limiting the bandwidth of the signal transmission. This render the system unsuitable for high-speed modulation.

Figure 8:
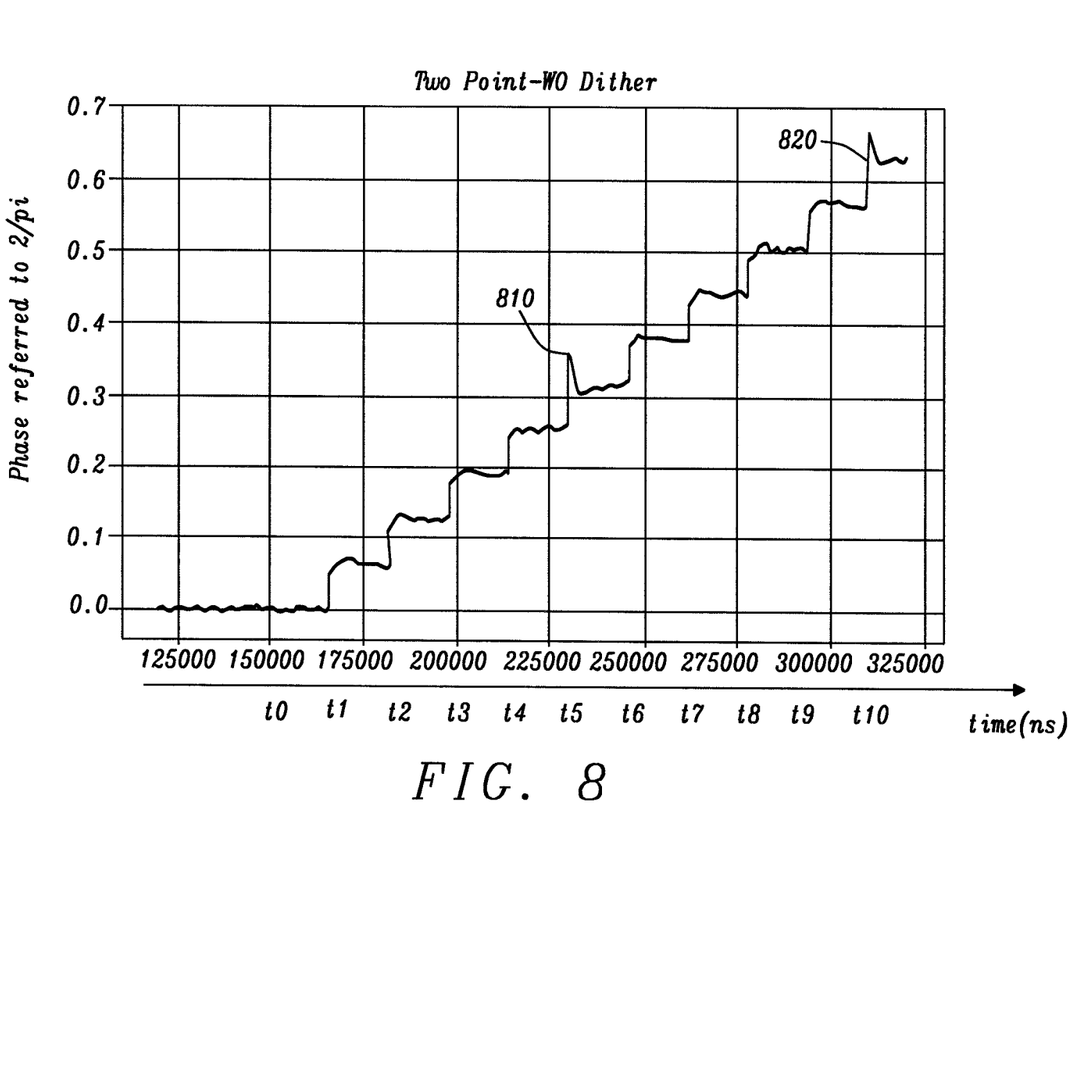
FIG. 8 is a simulation of the phase modulation of an input signal using both the low and the high frequency phase modulators of the circuit of FIG. 1, without dithering.

FIG. 8 is a simulation of the phase modulation of an input signal using both the low frequency phase modulator 120 and the high frequency phase modulator 160, hence providing two-point phase modulation. The simulation is obtained without dithering the output of the phase shifter 170, and the phase shifter has a coarse phase resolution. At time t0, the modulated signal is in phase with the input signal (zero phase difference). At time t1, the input signal is modulated with a first phase of 2π/16. A phase difference of 2π/16 is then added incrementally at times t2-t10. The phase of the modulated signal stabilises quickly as shown by the step profiles. However, a sharp overshoot also referred to as peaking 810, 820 occurs at times t5 and t10 respectively due to gain mismatch between the low frequency path and the high frequency path. Using the high frequency modulator increases the time response of the system. However the system resolution is limited by periodic overshoots. The output phase accuracy may be improved by performing sigma-delta modulation (SDM) dithering of the output of the phase shifter 170.

Figure 9:
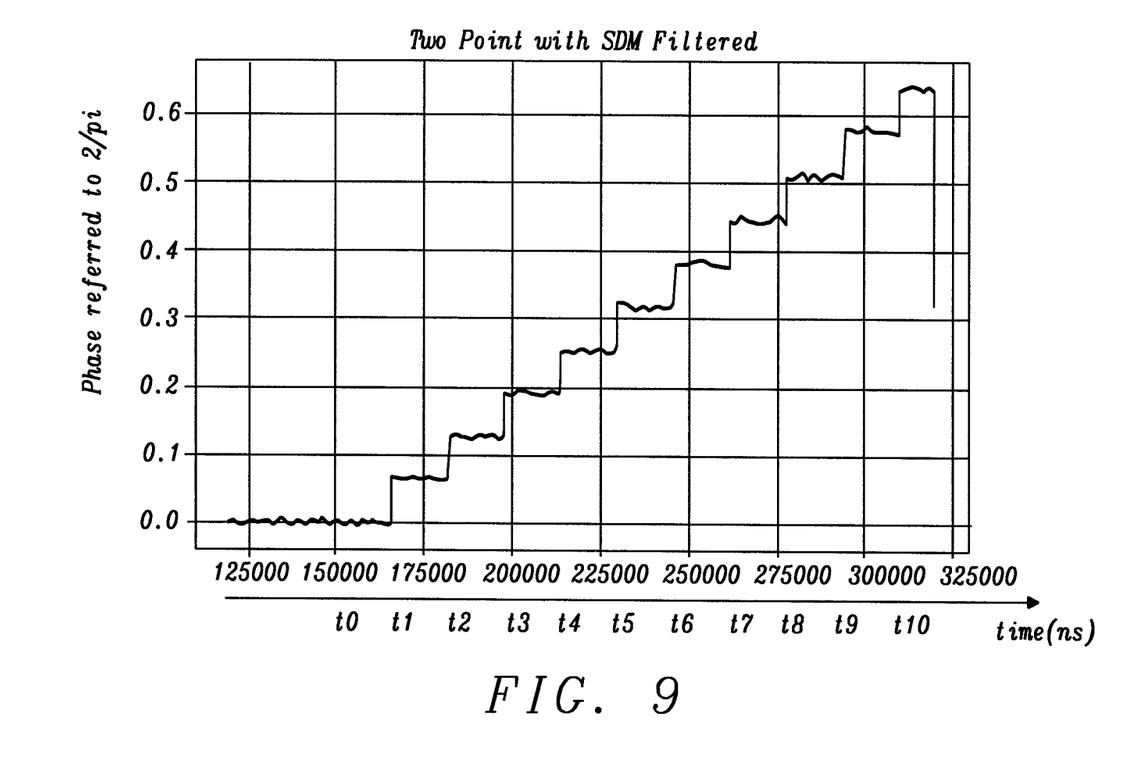
FIG. 9 is yet another simulation of the phase modulation of an input signal using both the low and the high frequency phase modulators of the circuit of FIG. 1, with dithering.

FIG. 9 is a simulation of the phase modulation of an input signal using both the low frequency phase modulator 120 and the high frequency phase modulator 160. The simulation is obtained with SDM dithering the output of the phase shifter and filtering. The modulated signal displays a sharp step like profile without transient overshoots. This demonstrates a fast response of the system suitable for fast data communication.

Figure 10:
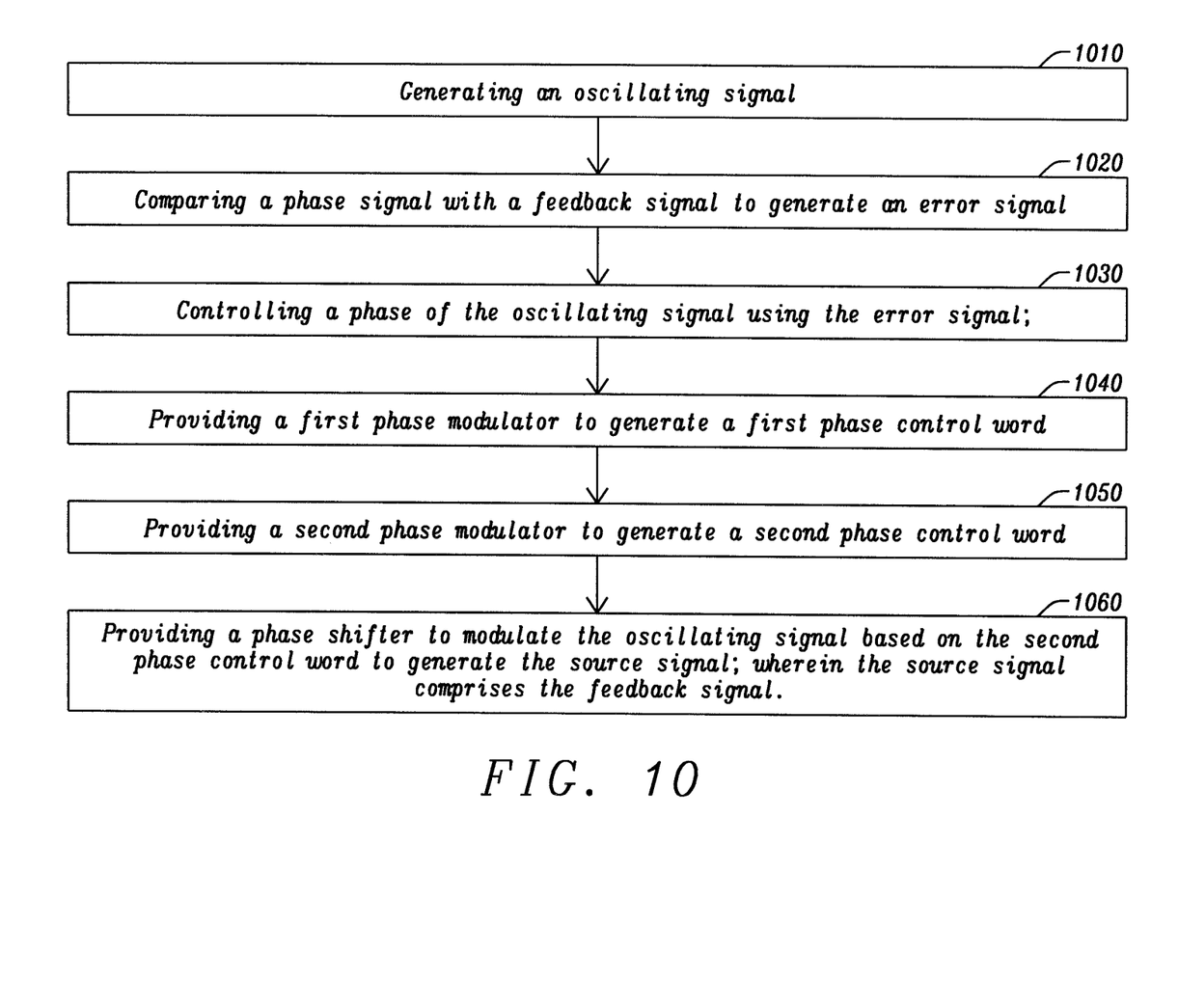
FIG. 10 is a flow chart of a method for generating a source signal according to the disclosure.

FIG. 10 is a flow chart of a method for generating a source signal according to the disclosure. At step 1010, an oscillating signal is generated. At step 1020, an error signal is generated by comparing a phase signal with a feedback signal. At step 1030, the phase of the oscillating signal is controlled using the error signal. For instance, the error signal may be used to control the phase of the oscillating signal such that the oscillating signal is in phase with the phase signal. At step 1040, a first phase modulator is provided to generate a first phase control word (PMLP). At step 1050, a second phase modulator is provided to generate a second phase control word (PMHP). At step 1060, a phase shifter is provided to modulate the oscillating signal based on the second phase control word to generate the source signal. The source signal comprises the feedback signal.

Figure 11:
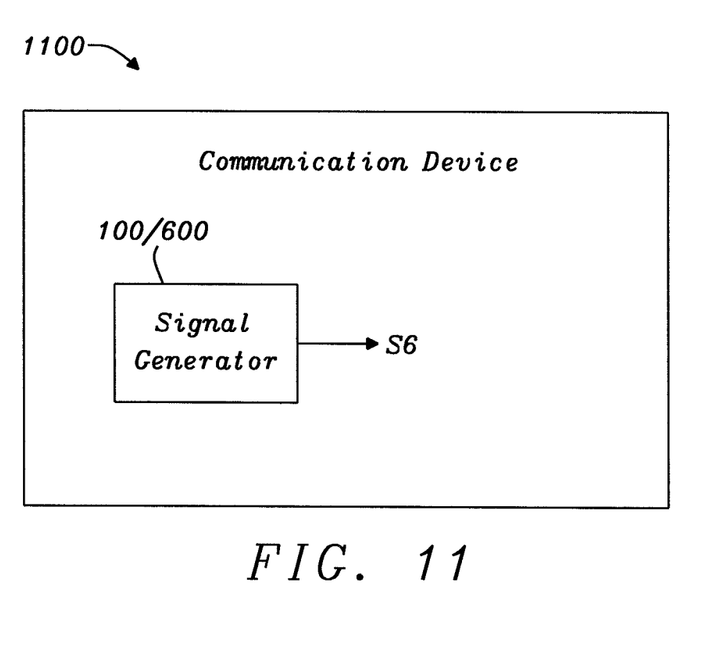
FIG. 11 is a diagram of a communication device including a signal generator according any one of the FIG. 1, 5 or 6.

FIG. 11 is a diagram of a communication device such as a WIFI or a Bluetooth device, that includes a signal generator. For instance, the signal generator may be implemented as the signal generator 100 of FIG. 1, or the signal generator 500 of FIG. 5 or the signal generator 600 of FIG. 6. A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A signal generator for generating a source signal, the signal generator comprising
   a frequency generator adapted to provide an oscillating signal;
   a phase comparator adapted to compare a phase signal with a feedback signal and to generate an error signal to control the phase of the oscillating signal;
   a first phase modulator adapted to provide a first phase control word;
   a second phase modulator adapted to provide a second phase control word;
   a phase shifter adapted to modulate the oscillating signal based on the second phase control word to generate the source signal; wherein the source signal comprises the feedback signal.

2. The signal generator as claimed in claim 1, wherein the error signal is configured to control the phase of the oscillating signal such that the oscillating signal is in phase with the phase signal.

3. The signal generator as claimed in claim 1, comprising a phase accumulator adapted to receive an input frequency control word and to generate a phase reference signal, and an adder, the adder being adapted to add the phase reference signal to the first phase control word to generate the phase signal.

4. The signal generator as claimed in claim 1, wherein the phase shifter is adapted to generate a source signal comprising a plurality of component signals each component signal having a different phase with respect to the feedback signal.

5. The signal generator as claimed in claim 1, wherein the phase shifter comprises a digital to time converter.

6. The signal generator as claimed in claim 1, wherein the phase shifter comprises an adaptive filter or a switched filter bank.

7. The signal generator as claimed in claim 1, wherein the phase shifter comprises a combiner provided with a pair of adjustable channel gains coupled to a controller configured to adjust the channel gains based on the second phase control word.

8. The signal generator as claimed in claim 3, comprising
   a first frequency modulator adapted to generate a first frequency modulated control word; and
   an adder to add the input frequency control word to the first frequency modulated control word to generate an adjusted frequency control word.

9. The signal generator as claimed in claim 8, comprising a second frequency modulator coupled to the frequency generator, the second frequency modulator being adapted to generate a second frequency modulated control word to modulate the frequency of the oscillating signal.

10. The signal generator as claimed in claim 9, comprising a controller coupled to the first phase modulator, the second phase modulator, the first frequency modulator and the second frequency modulator; the controller being adapted to control a state of the first and second phase modulators and the first and second frequency modulators.

11. A communication device comprising a signal generator as claimed in claim 1.

12. A method of generating a source signal, the method comprising
    generating an oscillating signal;
    comparing a phase signal with a feedback signal to generate an error signal;
    controlling a phase of the oscillating signal using the error signal;
    providing a first phase modulator to generate a first phase control word;
    providing a second phase modulator to generate a second phase control word;
    providing a phase shifter to modulate the oscillating signal based on the second phase control word to generate the source signal; wherein the source signal comprises the feedback signal.

13. The method as claimed in claim 12, wherein the error signal controls the phase of the oscillating signal such that the oscillating signal is in phase with the phase signal.

14. The method as claimed in claim 12, wherein the phase signal comprises a sum of a phase reference signal and the first phase control word.

15. The method as claimed in claim 12, wherein the source signal comprises a plurality of component signals each component signal having a different phase with respect to the feedback signal.

* * * * *